United States Patent
Osoinach et al.

(10) Patent No.: US 8,481,873 B2
(45) Date of Patent: Jul. 9, 2013

(54) CAPACITIVE TOUCH SENSOR DEVICE CONFIGURATION SYSTEMS AND METHODS

(75) Inventors: Bryce T. Osoinach, Phoenix, AZ (US); Tsukasa Hoshi, Sendai (JP); Toshiaki Ito, Sendai (JP); Katsuaki Morishita, Sendai (JP); Eiji Shikata, Sendai (JP); Keiji Tenaka, Kurokawa-gun (JP); Craig R. Teegarden, Pittsburgh, PA (US)

(73) Assignee: Freescale Semiconductor, Inc., Austin, TX (US)

( * ) Notice: Subject to any disclaimer, the term of this patent is extended or adjusted under 35 U.S.C. 154(b) by 817 days.

(21) Appl. No.: 12/570,829

(22) Filed: Sep. 30, 2009

(65) Prior Publication Data

US 2011/0073384 A1 Mar. 31, 2011

(51) Int. Cl.
*G06F 3/044* (2006.01)

(52) U.S. Cl.
USPC ........... 178/18.06; 345/212; 345/76; 324/679

(58) Field of Classification Search
None
See application file for complete search history.

(56) References Cited

U.S. PATENT DOCUMENTS

| | | | |
|---|---|---|---|
| 4,145,748 A | 3/1979 | Eichelberger et al. | |
| 5,036,321 A | 7/1991 | Leach et al. | |
| 5,760,715 A | 6/1998 | Senk et al. | |
| 2005/0104862 A1 | 5/2005 | Kaski | |
| 2005/0243038 A1* | 11/2005 | Kwak | 345/76 |
| 2007/0247172 A1 | 10/2007 | Li | |
| 2009/0073111 A1* | 3/2009 | Miyazaki | 345/107 |
| 2009/0167325 A1 | 7/2009 | Geaghan | |
| 2010/0309189 A1* | 12/2010 | Mizusako et al. | 345/212 |
| 2011/0073384 A1* | 3/2011 | Osoinach et al. | 178/18.06 |
| 2011/0115440 A1* | 5/2011 | Sabi et al. | 320/145 |
| 2011/0120784 A1* | 5/2011 | Osoinach et al. | 178/18.06 |
| 2011/0187389 A1* | 8/2011 | Han et al. | 324/679 |

FOREIGN PATENT DOCUMENTS

KR 1020090030114 A 3/2009

OTHER PUBLICATIONS

PCT Application No. PCT/US2010/045583; Search Report and Written Opinion dated Apr. 28, 2011.

* cited by examiner

*Primary Examiner* — Van Chow
(74) *Attorney, Agent, or Firm* — Sherry W. Schumm

(57) ABSTRACT

Embodiments include capacitive touch sensors and methods for configuring capacitive touch sensors. A capacitive touch sensor embodiment includes an analog-to-digital converter (ADC) and a controller. The ADC receives an analog voltage signal from an electrode, and samples the analog voltage signal to produce a plurality of digital values. The controller performs a first charging process by supplying the electrode with a first charging current for a first charging interval, and the controller determines, based on the digital values, whether a first electrode voltage value meets a criteria. If not, the controller performs a configuration process that results in setting a second charging current and a second charging interval for the electrode which, in response to performing a second charging process, results in a second electrode voltage value that meets the criteria.

20 Claims, 5 Drawing Sheets

CAPACITIVE TOUCH SENSOR DEVICE CONFIGURATION SYSTEMS AND METHODS

TECHNICAL FIELD

Embodiments relate to capacitive touch sensor devices, and more particularly to methods and apparatus for configuring capacitive touch sensor devices.

BACKGROUND

Capacitive touch sensor devices have been incorporated into a variety of consumer electronics, including cellular telephones, computers, portable entertainment devices, appliances, and touch screens, to name a few. At a minimum, a capacitive touch sensor device includes one or more sensors (or "electrodes"), a charging circuit, and a touch detection circuit. Each sensor may be associated with a possible user input. For example, to enable a user to make a telephone call, a cellular telephone may include an array of at least twelve sensors, with ten of the sensors being associated with each of the numbers from 0 to 9, an eleventh sensor being associated with a "SEND" key, and a twelfth sensor being associated with an "END" key.

A typical sensor includes a dielectric touch plate (e.g., a glass plate) and an electrode, which function as a dielectric and an electrode of a capacitor, respectively. When a user touches the touch plate at a sensor location, a potential variation in the electrode is produced due to a capacitive circuit formed between the Earth, the user, and the sensor. The capacitive touch sensor device periodically and frequently measures the potential of the electrode in order to determine whether or not a touch has occurred. Prior to measuring the potential, the charging circuit charges the electrode by providing the electrode with a pre-determined current for a pre-determined time. At the culmination of the charging process, the touch determination circuit measures the voltage between the electrode and ground (or some other fixed potential). When the measured voltage falls sufficiently below a baseline value associated with a no-touch condition (e.g., below a touch detection threshold), the touch determination circuit may indicate that a touch has been sensed. The charging and measurement procedures continue to be repeated, and when the measured voltage later rises toward the baseline value by a sufficient amount (e.g., above a release detection threshold), the touch determination circuit may then indicate that a release has been sensed.

The theoretical range of charges that can be applied to the electrode is constrained to correspond to measurable voltages between zero volts (or ground) and the supply voltage to the device. However, accurate charging and measurement typically can be obtained only for voltages that fall within a central range of the theoretical range. For example, for a device that has a supply voltage of 1.7 volts, reliably accurate voltage measurement may not be possible for voltages within the lower 0.7 volts of the range, and reliably accurate charging may not be possible to achieve voltages within the upper 0.7 volts of the range. Accordingly, accurate charging and measurement may be achievable only for measurable voltages within the central 0.3 volts of the theoretical range.

System designers desiring to incorporate such a capacitive touch sensor device within a product should, therefore, set the charging parameters (e.g., a supplied current and charging interval) so that the charging process results in a voltage that falls within the central range. However, capacitance changes in the system due to external factors (e.g., temperature or humidity changes, transmission frequency changes, and so on) may cause a touch detection threshold or a touch release threshold to move outside of the central, accurately measurable range of voltages. When a threshold moves into the lower portion of the voltage range (e.g., the lower 0.7 volts), accurate measurement may not be possible. When a threshold moves into the upper portion of the voltage range (e.g., the upper 0.7 volts), accurate charging may not be possible. In either case, false touch detections or releases may occur and/or the system may fail to detect actual touches or releases.

Because of these characteristics of conventional capacitive touch sensor devices, system designers typically set charging parameters to produce voltages within the center of the central range (e.g., at 0.85 volts for a 1.7 volt system). Although this practice may increase reliability of the device, device sensitivity is not optimized. In addition, semiconductor device variations may significantly affect the operation of current supplies and timers associated with the charging process. Thus, yields for capacitive touch sensor devices should be low enough to ensure that supplied devices are capable of performing charging process that result in measurable voltages substantially at the center of the range.

DETAILED DESCRIPTION

Capacitive touch sensor devices are needed, which may reliably achieve accurate touch detection in the face of significant capacitance changes due to external factors. Further needed are capacitive touch sensor devices that allow system designers to set charging parameters for increased sensitivity, if they so choose, while still achieving high reliability. Further needed are methods and apparatus for configuring capacitive touch sensor devices, which may enable system manufacturers to have higher device yields, when compared with device yields of conventional devices.

Embodiments described herein include capacitive touch sensor devices and methods for configuring capacitive touch sensor devices. Embodiments include capacitive touch sensor devices that may reliably achieve accurate touch detection in the face of significant capacitance changes due to external factors. Embodiments also may allow system designers to set charging parameters for increased sensitivity, if they so choose, while still achieving high reliability. In addition, embodiments may enable system manufacturers to have higher device yields, when compared with device yields of conventional devices. More details of various embodiments will now be described in conjunction with FIGS. 1-7.

Figure 1:
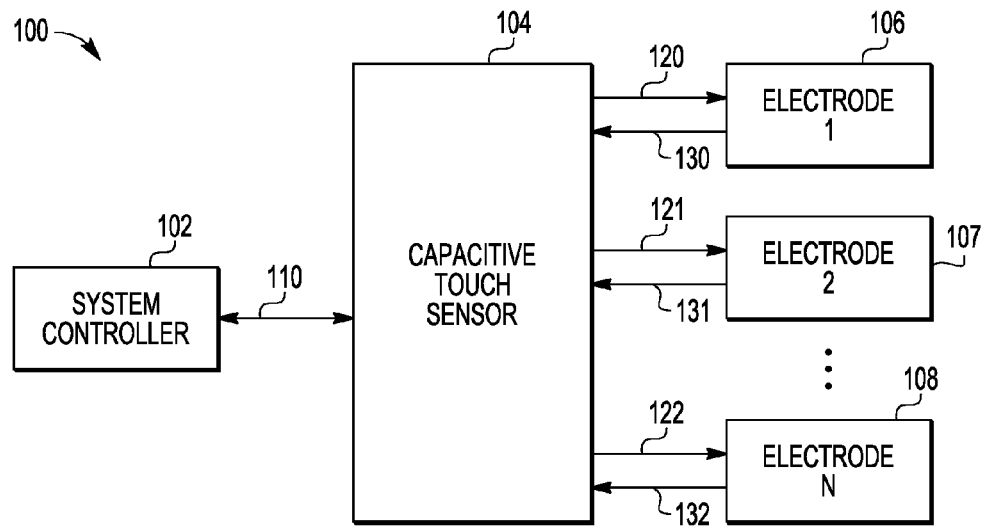
FIG. 1 illustrates a simplified block diagram of a portion of an electronic system within which a capacitive touch sensor system is incorporated, according to an example embodiment.

FIG. 1 illustrates a simplified block diagram of a portion of an electronic system 100 within which a capacitive touch sensor system is incorporated, according to an example embodiment. The portion of the system 100 may be incorporated within a cellular telephone, a radio, a computer, a portable entertainment device, an appliance, a touch screen, or any of various other types of electronic devices. According to an embodiment, the system 100 includes a controller 102, a capacitive touch sensor 104, and from one to N touch pad electrodes 106, 107, 108, where N is an integer (e.g., an integer in a range from 1 to hundreds).

Each touch pad electrode 106-108 is arranged in physical proximity to a dielectric touch plate (or a portion thereof). Each electrode 106-108 and its associated dielectric touch plate function as one electrode and a dielectric of a capacitor, respectively. As with a conventional device, when a user touches a portion of a dielectric touch plate associated with a sensor location (e.g., directly above an electrode 106-108), a potential variation in the electrode 106-108 is produced due to a capacitive circuit formed between ground potential (e.g., the Earth), the user, and the electrode 106-108. Through an electrode charging and voltage measurement process, the capacitive touch sensor 104 can determine whether the capacitance associated with an electrode 106-108 has changed sufficiently to indicate that a "touch event" or a "release event" has occurred. However, unlike conventional devices and as will be described in more detail below, embodiments include methods and apparatus that perform an automatic charge configuration process, which may ensure that each electrode 106-108 is charged to a voltage that falls within a central voltage region under a wide variety of circumstances and device variations.

Capacitive touch sensor 104 is operatively coupled with each electrode 106-108 through charging lines 120, 121, 122 and measurement lines 130, 131, 132. Although charging lines 120-122 and measurement lines 130-132 are shown to be distinct lines in FIG. 1, it is to be understood that the charging and measurement processes may be performed for an electrode over a single line (e.g., charging line 120 and measurement line 130 are the same line). In other words, the charging and measurement processes may be performed for an electrode using two pins or a single pin of capacitive touch sensor 104, according to various embodiments.

According to an embodiment, capacitive touch sensor 104 is configured to store and dynamically maintain charge configuration information for each electrode 106-108, where the charge configuration information includes at least a baseline voltage, a charging current, and a charging interval for each electrode 106-108. Using electrode 106 as an example, in order to charge electrode 106, capacitive touch sensor 104 supplies a current over charge line 120, where the supplied current has a magnitude equal to the stored charging current for electrode 106. The charging current is supplied for the stored charging interval for electrode 106, and then the charging process is terminated. Capacitive sensor 104 then measures the voltage of the electrode 106 over measurement line 130, and compares the measured voltage with the stored baseline voltage for electrode 106. When the difference between the measured voltage and the stored baseline voltage does not exceed a touch detection delta, the capacitive touch sensor 104 may make a determination that electrode 106 is in a "no-touch state". Conversely, when the difference between the measured voltage and the baseline voltage exceeds the touch detection delta, the capacitive touch sensor 104 may make a determination that a touch event has occurred, and thus that electrode 106 is in a "touch state". While in the touch state, the capacitive touch sensor 104 may continue to repeat the charging and measuring process until a comparison between the measured voltage and the baseline voltage yields a difference that is less than a release detection delta. At that time, the capacitive touch sensor 104 may determine that a release event has occurred, and thus that electrode 106 is again in the no-touch state.

Capacitive touch sensor 104 is operatively coupled with system controller 102. System controller 102 may include a special purpose or general purpose microprocessor, a digital signal processor, an Application Specific Integrated Circuit (ASIC), or some other type of processing component. System controller 102 and capacitive touch sensor 104 may communicate over communication interface 110. According to an embodiment, the communication interface 110 may include one or more interrupt lines and one or more communication lines. For example, communication interface 110 may include transmission means to support an $I^2C$ (Inter-Integrated Circuit) communication protocol, in an embodiment. In other embodiments, communication interface 110 may include transmission means to support an SPI (Serial Peripheral Interface) protocol, a UART (Universal Asynchronous Receiver/Transmitter) protocol, or some other type of inter-processor communication protocol.

Various types of interrupts, control messages, and data may be transferred over communication interface 110. For example, system controller 102 may provide control messages over communication interface 110, which are adapted to activate or deactivate capacitive touch sensor 104. In addition, when capacitive touch sensor 104 detects a touch event or a release event, capacitive touch sensor 104 may provide an interrupt over communication interface 110. In response to the interrupt, system controller 102 may provide a request for information regarding the interrupt (e.g., a request to read a register of capacitive touch sensor 104 that describes the triggering event for the interrupt). Capacitive touch sensor 104 may then return data which indicates, for example, an electrode identity and an indicator of a touch event or a release event. System controller 102 may then take whatever action is appropriate, given the circumstances.

Figure 2:
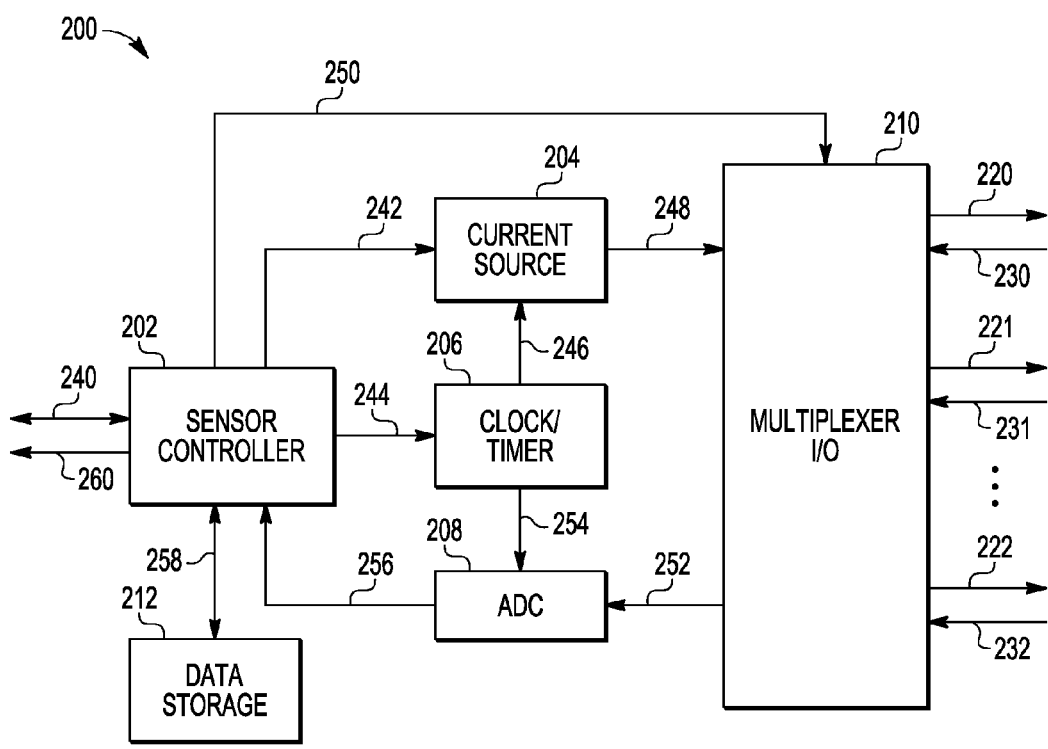
FIG. 2 illustrates a simplified block diagram of a capacitive touch sensor, according to an example embodiment.

More detail regarding various embodiments of capacitive touch sensors and automatic configuration methods and apparatus will now be described. FIG. 2 illustrates a simplified block diagram of a capacitive touch sensor 200 (e.g., capacitive touch sensor 104, FIG. 1), according to an example embodiment. Capacitive touch sensor 200 includes a sensor controller 202, a current source 204, a clock/timer 206, an analog-to-digital converter (ADC) 208, a multiplexer input/output (I/O) 210, and data storage 212, according to an embodiment. These components may be incorporated into a single integrated circuit, or some or all of the components may be implemented as separate devices.

Sensor controller 202 is configured to communicate with an external controller (e.g., system controller 102, FIG. 1) through one or more communication lines 240 and one or more interrupt lines 260. According to an embodiment, and in response to receiving a control message over communication line 240, sensor controller 202 may initiate the process of monitoring one or more external electrodes (e.g., electrodes 106-108, FIG. 1) to determine whether voltages present on the electrodes exhibit properties indicating a no-touch state, a touch state, a touch event or a release event. In addition, upon detection of a touch event or a release event, sensor controller 202 may store, via lines 258, information describing the event in data storage 212, and may send an interrupt over an interrupt line 260. The information describing the event may include, for example, an electrode identity and the type of event (e.g., touch or release). Alternatively, the information may include an electrode identity and the electrode's current state (e.g., touch state or no-touch state). In addition, sensor controller 202 may store an indication of the newly entered state in data storage 212. For example, sensor controller 202 may store an indication that the electrode is in a touch state when a touch event occurs, and sensor controller 202 may store an indication that the electrode is in a no-touch state when a release event occurs. Upon receiving a request for information regarding the interrupt over a communication line 240, sensor controller 202 may retrieve the information from data storage 212, and may send a response over a communication line 240 that includes the event description. Sensor controller 202 also may receive a control message over communication line 240, which indicates that sensor controller 202 should discontinue electrode monitoring (e.g., when the device is powering down), and sensor controller 202 may discontinue electrode monitoring accordingly.

Data storage 212 may include one or more registers or other volatile storage means adapted to store touch and release event information and electrode-specific parameters, which will be discussed in more detail below. In addition, data storage 212 may include one or more non-volatile storage means adapted to store sensor initialization information. For example, sensor initialization information may include, for each electrode monitored by capacitive touch sensor 200, default charging parameters. The default charging parameters may include, for example, a default charging current, a default charging interval, and a default baseline value associated with a no-touch condition. In addition, data storage 212 may include a touch detection delta value and a release detection delta value. Alternatively, data storage 212 may include a default touch detection threshold (e.g., the default baseline value minus a touch detection delta) and a default release detection threshold (e.g., the default baseline value minus a release detection delta). The use of each of these parameters will be discussed in more detail below.

Upon initiation of the electrode monitoring process (e.g., in response to a control signal received over a communication line 240), sensor controller 202 may select a first electrode (e.g., electrode 106, FIG. 1) for monitoring by providing a select signal over multiplexer control line 250 to multiplexer I/O 210. Sensor controller 202 may retrieve the default charging parameters for the selected electrode from data storage 212, and may provide a control signal to current source 204 over control line 242, which indicates the default charging current. In addition, sensor controller 202 may provide a clock/timer control signal over control line 244 to clock/timer 206, which indicates the default charging interval for the selected electrode. Clock/timer 206 may thereafter provide an enable signal to current source 204 over control line 246, which causes current source 204 to produce a current at the default charging current on current output line 248. Upon expiration of the default charging interval, clock/timer 206 may provide a disable signal to current source 204 over control line 246, which causes current source 204 to cease providing current on current output line 248. The current provided on current output line 248 is provided to the selected electrode on one of charging lines 220, 221, 222.

Figure 3:
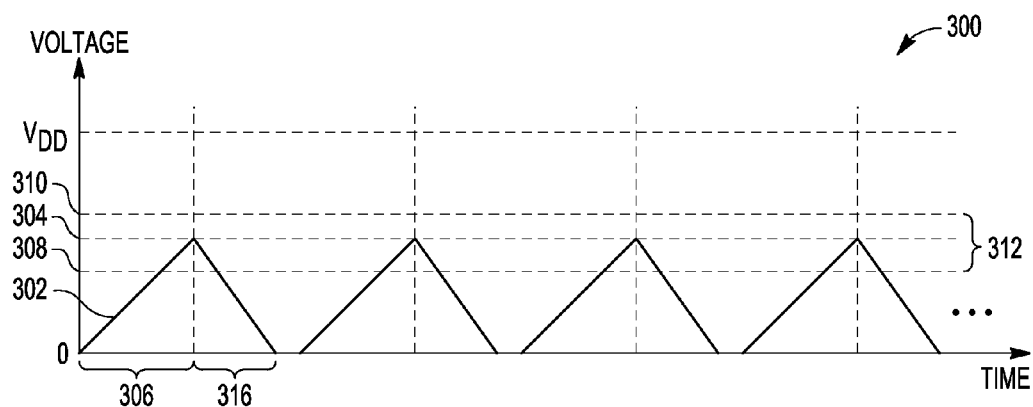
FIG. 3 is a chart illustrating an example of an electrode charging/discharging profile for a plurality of charging and measurement cycles for a selected electrode, according to an embodiment.

FIG. 3 is a chart illustrating an example of an electrode charging/discharging profile 300 for a plurality of charging and measurement cycles for a selected electrode, according to an embodiment. Current (e.g., current at the default or stored charging current) is provided to the electrode (e.g., by current source 204, FIG. 2) so that the voltage of the electrode increases in a linear manner, according to an embodiment. For example, voltage segment 302 shows an electrode voltage increasing linearly from zero volts (e.g., for a properly grounded electrode) to a target voltage 304 during a charging interval 306. The target voltage 304 desirably falls between a lower voltage threshold 308 and an upper voltage threshold 310, which together bound a target voltage range 312 within the theoretical voltage range.

The target voltage range 312 may correspond with a central range of the theoretical operating range of the device, where the theoretical operating range may be from zero volts to the supply voltage, $V_{DD}$, for example. More particularly, the lower voltage threshold 308 may correspond to a voltage below which accurate measurement may not be reliably achieved, and the upper voltage threshold 310 may correspond to a voltage above which accurate charging may not be reliably achieved. For example, for a device that has a supply voltage, $V_{DD}$, of 1.7 volts, reliably accurate voltage measurement may not be possible for voltages within the lower 0.7 volts of the range, and reliably accurate charging may not be possible to achieve voltages within the upper 0.7 volts of the range. Accordingly, the lower voltage threshold 308 may be approximately 0.7 volts, the upper voltage threshold may be approximately 1.0 volts, and the target voltage range 312 may include approximately a 0.3 volt range between 0.7 and 1.0 volts.

According to another embodiment, the target voltage range 312 may be defined to be a sub-range within the central range. For example, when increased device sensitivity is desired, the target voltage range 312 may be defined as an upper portion of the central range (e.g., the upper 90% to 100% of the central range). Conversely, when increased reliability is desired, the target voltage range 312 may be defined as a central portion of the central range (e.g., the central 45% to 55% of the central range). The target voltage range 312 may be established by storing (e.g., in data storage 212, FIG. 2) values representing a lower target range limit ("LTRL") and an upper target range limit ("UTRL") in the factory, although the LTRL and/or the UTRL also or alternatively may be determined and stored by a device designer while incorporating the capacitive touch sensor within a system (e.g., system 100, FIG. 1).

When provision of the current is terminated (e.g., at the end of charging interval 306, FIG. 3), the capacitive touch sensor may measure the voltage of the electrode. Referring again to FIG. 2, sensor controller 202 may perform a voltage measurement for the selected electrode by providing another control signal to multiplexer I/O 210 over multiplexer control line 250, which enables multiplexer I/O 210 to access an analog voltage signal for the selected electrode over one of measurement lines 230, 231, 232. As discussed previously, although charging lines 220-222 and measurement lines 230-232 are shown to be distinct lines in FIG. 2, it is to be understood that the charging and measurement processes may be performed for an electrode over a single line (e.g., charging line 220 and measurement line 230 may be the same line).

Multiplexer I/O 210 provides the analog voltage signal to ADC 208 over analog voltage line 252. In response to a clock signal provided by clock timer 206 over control line 254, ADC 208 converts the received analog voltage signal to a digital value, which may be represented as an ADC count, according to an embodiment. In other words, ADC 208 samples the analog voltage signal in order to produce a plurality of digital values. ADC 208 then provides the sampled, digital values to sensor controller 256 over digital voltage line 256. Referring also to FIG. 3, the electrode may then be discharged to zero volts during a discharge interval 316, and the process may be repeated one or more times in order to obtain one or more additional voltage measurements for the same selected electrode. More particularly, sensor controller 202 may cause the charging and voltage measurement processes to be repeated one or more times for the selected electrode, and may then evaluate the measured voltages to determine, for example, whether a touch event or a release event has occurred. Although four charging/discharging iterations are shown in FIG. 3, more or fewer may be performed. As will be described in more detail below, determination of whether a touch event or a release event has occurred may include using a plurality of voltage measurements to determine a "short-term" electrode voltage value ("STEVV"), and using a plurality of STEVVs to determine a "long-term" electrode voltage value ("LTEVV"). The LTEVV may then be evaluated to determine how the value compares with touch detection and touch release thresholds. As used herein, a measured "electrode voltage" or "electrode voltage value" may generically refer to a single measured electrode voltage value or a mathematically derived electrode voltage value based on a plurality of electrode voltage value measurements (e.g., an STEVV, an LTEVV, or another electrode voltage value that is derived from a plurality of measurements).

Sensor controller 202 may then select another electrode (e.g., electrode 107, FIG. 1) through a control signal to multiplexer I/O 210, and may repeat the charging and measurement process for the next selected electrode. This process may be performed for all remaining electrodes (e.g., through electrode 108, FIG. 1), thus completing a first iteration of monitoring the electrode voltages. Additional iterations of charging and monitoring the system's electrodes may thereafter be performed, beginning again with the first selected electrode (e.g., electrode 106, FIG. 1).

One or more of the initial charging and measuring iterations may use default values (e.g., a default charging current and default charging interval), as described above. The default values may be stored in data storage 212 in the factory during manufacture of the capacitive touch sensor 200, or may be initialized by a system designer who is incorporating the capacitive touch sensor 200 into a system (e.g., electronic system 100, FIG. 1). According to various embodiments, sensor controller 202 automatically may reconfigure the system by updating (e.g., determining and storing in data storage 212) different charging parameters for one or more of the electrodes during operation in the field. This may include updating the charging current and/or the charging interval for one or more of the electrodes. In addition, sensor controller 202 may automatically update, for each electrode, the baseline value associated with a no-touch condition, the touch detection threshold (and/or the touch detection delta value), and the release detection threshold (and/or the release detection delta value). Methods and apparatus for configuring and automatically reconfiguring the system and updating the various parameters will be discussed in more detail in conjunction with FIGS. 5-7.

As mentioned previously, capacitive touch sensor 200 is adapted to perform automatic configuration and/or reconfiguration processes, according to an embodiment. The automatic configuration process includes initially determining and storing a baseline value, a charging current, and a charging interval for each electrode (referred to herein as a "stored baseline value," a "stored charging current," and a "stored charging interval," respectively). The automatic reconfiguration process includes updating (e.g., determining and storing) the stored baseline value, the stored charging current, and the stored charging interval for each electrode. An automatic configuration process or an automatic reconfiguration process may be referred to simply as a "configuration process," herein. The automatic configuration process may be performed in conjunction with the charging and measurement procedures performed for each electrode.

As discussed briefly above, the capacitive touch sensor 200 may evaluate measured voltages to determine whether a touch event or a release event has occurred. According to an embodiment, when an electrode is in a no-touch state, determining whether a touch event has occurred includes determining whether the measured voltage is above or below a touch detection threshold. Conversely, when the electrode is in a touch state, determining whether a release event has occurred includes determining whether the measured voltage is above or below a release detection threshold.

Figure 4:
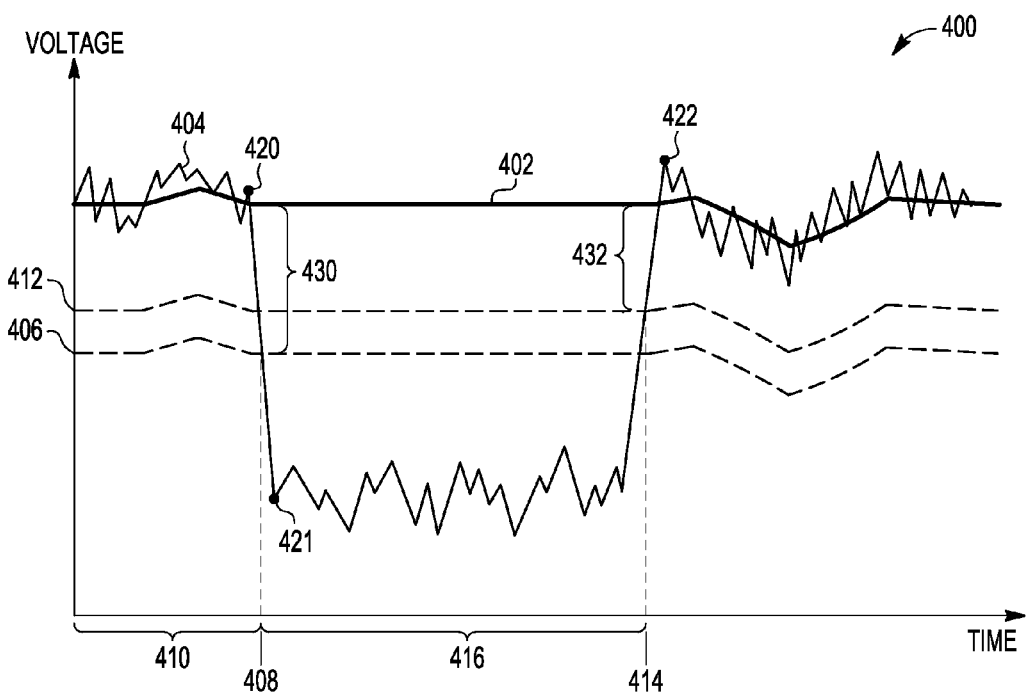
FIG. 4 is a chart illustrating example electrode voltage measurements plotted in conjunction with a baseline and touch/release detection thresholds, according to an example embodiment.

FIG. 4 is provided in conjunction with describing the baseline value, the touch detection threshold, and the release detection threshold. More particularly, FIG. 4 is a chart 400 illustrating example voltage measurements 420, 421, 422 plotted in conjunction with a baseline 402 and touch/release detection thresholds 406, 412 for a single electrode, according to an example embodiment. Although only three discrete electrode voltage measurements 420-422 are indicated in FIG. 4, the voltage measurement signal 404 represents a plurality of measurement points, which are shown to be connected together as a continuous voltage measurement signal 404 for clarity of description. Similarly, although the baseline 402 is illustrated as a continuous signal for clarity of description, the baseline actually may be represented in the system by the stored baseline value. In various embodiments, each voltage measurement 420-422 may represent the result of a single measurement for a single charging and measurement cycle for the electrode, or each voltage measurement 420-422 may represent a plurality of measurements for a plurality of charging and measurement cycles for the electrode (e.g., an STEVV or an LTEVV). Either way, the voltage measurements 420-422 may be different from measurement-to-measurement, as is depicted in FIG. 4.

Beginning from the left side of chart 400, a plurality of voltage measurements (including voltage measurement 420) are taken during a time interval 410 when the electrode is in a no-touch state. The electrode may be considered to be in a no-touch state when voltage measurements for the electrode have values that are above a touch detection threshold 406. According to an embodiment, at any given time, the touch detection threshold 406 is equal to the stored baseline value minus a touch detection delta 430. In an embodiment, the touch detection delta 430 is a fixed value, although the touch detection delta 430 may be an adjustable value in another embodiment. FIG. 4 illustrates that voltage measurement 420 is above the touch detection threshold 406, and accordingly a comparison of voltage measurement 420 with the touch detection threshold 406 will indicate that the electrode is in the no-touch state.

According to an embodiment, the baseline 402 may be dynamically adjusted while the electrode is in the no-touch state, as will be discussed in more detail later. Dynamic adjustment of baseline 402 is shown in FIG. 4 by the increasing and decreasing nature of baseline 402 during time interval 410. As baseline 402 is dynamically adjusted, the touch detection threshold 406 and the touch release threshold 412 also are dynamically adjusted, as depicted in FIG. 4.

Continuing across chart 400 toward the right, the voltage measurement signal 404 drops below the touch detection threshold 406 at time 408. Accordingly, a comparison of voltage measurement 421 with the touch detection threshold 406 will indicate that the electrode is now in the touch state. As will be described in more detail later, the system may generate an interrupt (e.g., on an interrupt line 260, FIG. 2) when a transition from a no-touch state to a touch state is detected. The electrode may be considered to remain in a touch state when voltage measurements for the electrode have values that are below a touch release threshold 412. According to an embodiment, at any given time, the touch release threshold 412 is equal to the stored baseline value minus a touch release delta 432.

As illustrated in FIG. 4, during time interval 416, the electrode remains in the touch state. Continuing once again across chart 400 toward the right, the voltage measurement signal 404 rises above the release detection threshold 412 at time 414. Accordingly, a comparison of voltage measurement 422 with the release detection threshold 412 will indicate that the electrode is once again in the no-touch state. The electrode may be considered to remain in the no-touch state when voltage measurements for the electrode have values that are above the touch detection threshold 406.

In the depicted embodiment, the touch release threshold 412 is at a different voltage from the touch detection threshold 406, which provides hysteresis in the system. More particularly, the touch release threshold 412 is at a higher voltage than the touch detection threshold 406. In an alternate embodiment, the touch release threshold 412 may be at a lower voltage than the touch detection threshold 406. In yet another alternate embodiment, the touch release threshold 412 and the touch detection threshold 406 may be equal, in which case the system may maintain only one threshold for comparison purposes. These various embodiments are intended to be included within the scope of the inventive subject matter.

Figure 5:
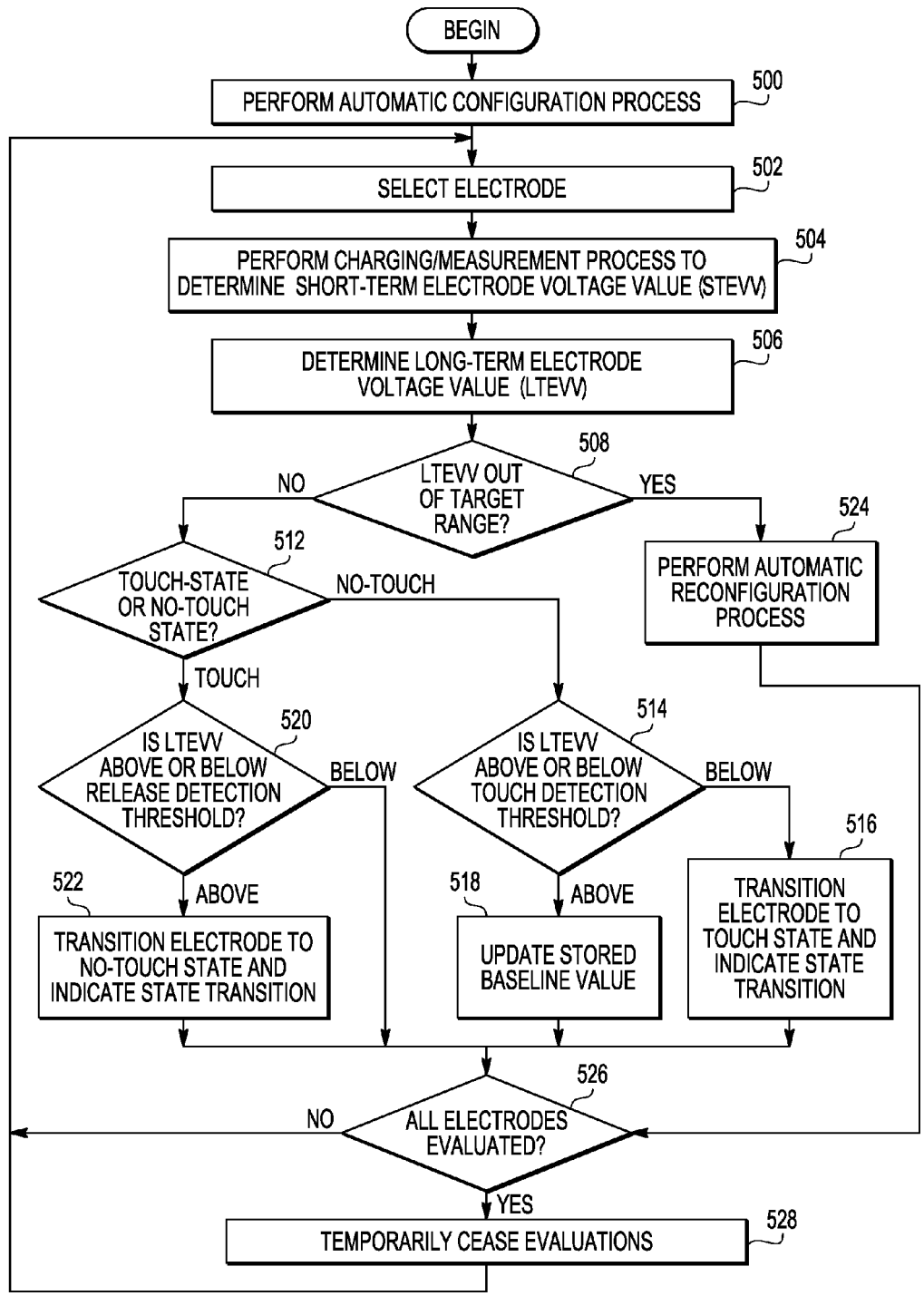
FIG. 5 is a flowchart of a method for performing touch/release detection and configuring a capacitive touch sensor, according to an example embodiment.

FIG. 5 is a flowchart of a method for performing touch/release detection and configuring a capacitive touch sensor, according to an example embodiment. According to an embodiment, the entire method may be performed by a capacitive touch sensor (e.g., capacitive touch sensor 200, FIG. 2) without assistance from any external processing entity (e.g., system controller 102, FIG. 1). In an alternate embodiment, portions of the method may be performed by an external processing entity.

The method may begin, in block 500, by performing an electrode configuration process in which initial charging parameters (e.g., an initial charging current, an initial charging interval, and an initial baseline value associated with a no-touch condition) are determined (e.g., by the capacitive touch sensor) and stored in the system (e.g., in data storage 212, FIG. 2) for each electrode (e.g., electrodes 106-108, FIG. 1). According to an embodiment, the electrode configuration process may be a system feature that is capable of being enabled or disabled. When disabled, block 500 may be bypassed, and the method may instead be initiated using default charging parameters (e.g., a default charging current, a default charging interval, and a default baseline value associated with a no-touch condition) that have been pre-stored in the system (e.g., in data storage 212, FIG. 2 during factory calibration). In yet another embodiment, the initial configuration process (i.e., block 500) may be excluded altogether. Various embodiments for performing a configuration process will be discussed in more detail in conjunction with FIGS. 6 and 7, later.

Upon completion of the configuration process (or if the process is bypassed or excluded), the capacitive touch sensor may enter an electrode monitoring state, within which the capacitive touch sensor repeatedly determines whether touch or release events are occurring for the system's electrodes. Blocks 502-528, described below, are associated with the electrode monitoring state. Although it may take several iterations of blocks 502-528 for the capacitive touch sensor to reach steady state operation, the below description assumes that a sufficient number of electrode voltage measurements have been performed to establish the capacitive touch sensor into steady state operation.

To initiate the electrode monitoring process, an electrode (e.g., one of electrodes 106-108, FIG. 1) is selected for evaluation, in block 502. As discussed previously, selection of an electrode may include a controller (e.g., sensor controller 202, FIG. 2) providing a select signal to electrode selection circuitry (e.g., providing a select signal over multiplexer control line 250 to multiplexer I/O 210, FIG. 2).

In block 504, a charging/measurement process is performed to determine a short term electrode voltage value ("STEVV"). According to an embodiment, the charging/measurement process includes performing a pre-defined number of charging and measurement cycles, as previously depicted in FIG. 3. The pre-defined number of charging and measurement cycles may be from two to ten cycles, for example, although the pre-defined number of charging and measurement cycles may be as few as one or greater than ten, in other embodiments (e.g., when the pre-defined number is one, the STEVV equals a single voltage measurement). An STEVV is determined from the results of the measurement processes. For example, the STEVV may be determined to be an average of the pre-defined number of measured voltages, although the STEVV may be determined using other mathematical relationships, in other embodiments.

In block 506, a long term electrode voltage value ("LTEVV") is determined from a pre-defined number of STEVVs. The pre-defined number of STEVVs may be from two to five STEVVs, for example, although the pre-defined number of STEVVs may be as few as one or greater than five, in other embodiments (e.g., when the pre-defined number is one, the LTEVV equals a single STEVV). According to an embodiment, the LTEVV may be determined to be an average of the pre-defined number of STEVVs, although the LTEVV may be determined using other mathematical relationships, in other embodiments.

In block 508, a determination is made whether the LTEVV meets a criteria. According to an embodiment, this includes determining whether the LTEVV has a value that falls within or outside of a pre-defined range of voltage values. More particularly, a determination is made whether the LTEVV has a value that falls outside of a target range (e.g., target voltage range 312, FIG. 3). As discussed previously, the target range may be defined by a lower target range limit ("LTRL") and an upper target range limit ("UTRL"), and may correspond to a central range of theoretical voltage values for the device, or a subset of a central range (e.g., an upper 90% to 100% of the central range for increased device sensitivity). According to other embodiments, determining whether the LTEVV meets the criteria may include determining whether the LTEVV is above or below a threshold (e.g., the lower or upper voltage thresholds 308, 310, FIG. 3).

When a determination is made that the LTEVV has a value that falls outside of the target range, then an automatic reconfiguration process is performed, in block 524. The reconfiguration process is considered to be "automatic" in that initiation of the process is based on an evaluation of a measured value (e.g., a measured voltage value such as the LTEVV) by the capacitive touch sensor, and accordingly does not require a system controller (e.g., system controller 102, FIG. 1) or any other outside entity to initiate the process. As is inherent in the flow of processes of FIG. 5, the reconfiguration process may be performed during a time interval that occurs while the capacitive touch sensor is between two different detected touch states. Essentially, the automatic reconfiguration process includes the capacitive touch sensor determining and storing new charging parameters (e.g., a new charging current, a new charging interval, or both) for the selected electrode. According to an embodiment, the electrode reconfiguration process may be a system feature that is capable of being enabled or disabled. When disabled, block 524 may be bypassed, and the method may instead proceed directly to block 526, which will be described later. Various embodiments for performing an automatic reconfiguration process will be discussed in more detail in conjunction with FIGS. 6 and 7, later.

Referring again to block 508, when the LTEVV does not fall outside of the target range (i.e., the LTEVV is within the target range), a further determination is made, in block 512, whether the electrode is in a touch state or a no touch state. As mentioned previously, the capacitive touch sensor may maintain (e.g., in data storage 212, FIG. 2) an indication of whether each electrode currently is in a touch state or a no-touch state. Upon a determination that the electrode is in a no-touch state, a further determination may be made, in block 514, whether the LTEVV is above or below the touch detection threshold (e.g., touch detection threshold 406, FIG. 4). For example, when the LTEVV has a value that is greater than the touch detection threshold, the LTEVV may be considered to be above the touch detection threshold. Conversely, when the LTEVV has a value that is less than the touch detection threshold, the LTEVV may be considered to be below the touch detection threshold. The determination of whether the LTEVV is above or below the touch detection threshold alternatively may be made by determining a difference between the LTEVV and the stored baseline value (e.g., a difference between voltage measurement 421 and baseline 404, FIG. 4), and further determining whether the difference is greater than (or greater than or equal to) a touch detection delta (e.g., touch detection delta 430, FIG. 4).

When it is determined that the LTEVV is below the touch detection threshold, then the electrode is transitioned to the touch state, in block 516. According to an embodiment, this may include the capacitive touch sensor storing an indication (e.g., in data storage 212, FIG. 2) that the electrode is now in the touch state. In addition, according to an embodiment, the capacitive touch sensor may indicate that a state transition (i.e., from the no-touch state to the touch state) has occurred. For example, the capacitive touch sensor may generate an interrupt (e.g., on an interrupt line 260, FIG. 2), which indicates that the electrode has changed states. As discussed previously, such an interrupt may cause a system controller (e.g., system controller 102, FIG. 1) to request information regarding the interrupt, and the capacitive touch sensor may return data which indicates, for example, an identity of the electrode and an indicator of a touch event. The system controller may then take whatever action is appropriate, given the circumstances.

Referring again to block 514, when it is determined that the LTEVV is above the touch detection threshold, then the may update the stored baseline value, in block 518. According to an embodiment, this may include overwriting the previously stored baseline value with the LTEVV. In addition, new touch detection and release detection thresholds may be determined and stored. This enables the baseline to be dynamically adjusted and accurately maintained in the presence of slowly-varying conditions. Although another embodiment may exclude dynamic adjustment of the baseline, this may increase a likelihood for false touch and/or release detections.

As discussed previously in conjunction with FIG. 4, dynamic adjustment of the baseline may be performed during time intervals when the electrode is in a no-touch state, and may be bypassed during time intervals when the electrode is in a touch state, according to an embodiment.

Referring again to block 512, when a determination is made that the electrode is in a touch state, a further determination may be made, in block 520, whether the LTEVV is above or below the release detection threshold (e.g., release detection threshold 412, FIG. 4). For example, when the LTEVV has a value that is greater than the release detection threshold, the LTEVV may be considered to be above the release detection threshold. Conversely, when the LTEVV has a value that is less than the release detection threshold, the LTEVV may be considered to be below the release detection threshold. The determination of whether the LTEVV is above or below the release detection threshold alternatively may be made by determining a difference between the LTEVV and the stored baseline value, and further determining whether the difference is greater than (or greater than or equal to) a release detection delta (e.g., release detection delta 432, FIG. 4).

When it is determined that the LTEVV is above the release detection threshold, then the electrode is transitioned to the no-touch state, in block 522. According to an embodiment, this may include the capacitive touch sensor storing an indication (e.g., in data storage 212, FIG. 2) that the electrode is now in the no-touch state. In addition, according to an embodiment, the capacitive touch sensor may indicate that a state transition (i.e., from the touch state to the no-touch state) has occurred. For example, the capacitive touch sensor may generate an interrupt (e.g., on an interrupt line 260, FIG. 2), which indicates that the electrode has changed states. As discussed previously, such an interrupt may cause a system controller (e.g., system controller 102, FIG. 1) to request information regarding the interrupt, and the capacitive touch sensor may return data which indicates, for example, an identity of the electrode and an indicator of a release event.

When it is determined that the LTEVV is below the release detection threshold (block 520) or upon completion of blocks 516, 518, 522 or 524 then the charging and measurement iteration is complete for that electrode, and a charging and measurement iteration may be performed for another electrode. Accordingly, in block 526, a determination may be made whether all electrodes have been evaluated (e.g., whether a charging and measurement iteration has been performed for each of electrodes 106-108, FIG. 1). If so, then the capacitive touch sensor may enter an idle state, in block 528, during which the capacitive touch sensor temporarily ceases electrode evaluations during an idle time period (e.g., from 1 to 100 milliseconds or some other time period). When it is determined that all electrodes have not been evaluated (block 526) or at the end of the idle time period, then the method may iterate as shown in FIG. 5, by once again selecting an electrode (block 502) and repeating the charging and measurement processes for all electrodes.

As discussed above in conjunction with block 524 of FIG. 5, a capacitive touch sensor may automatically reconfigure an electrode based on an evaluation of an electrode voltage value (e.g., the LTEVV). The automatic reconfiguration process may be performed substantially in hardware, according to an embodiment, or substantially in software, according to another embodiment. A hardware implementation may be desirable, for example, in a system that is not designed to include significant processing capabilities for cost or other reasons (e.g., a simple sensor such as a garage door opener). A software implementation may be desirable, for example, in a system in which significant processing capabilities are available either within the capacitive touch sensor or in a manner that is accessible to the capacitive touch sensor. Embodiments of substantially hardware implementations are discussed in conjunction with FIG. 6, and embodiments of substantially software implementations are discussed in conjunction with FIG. 7.

Figure 6:
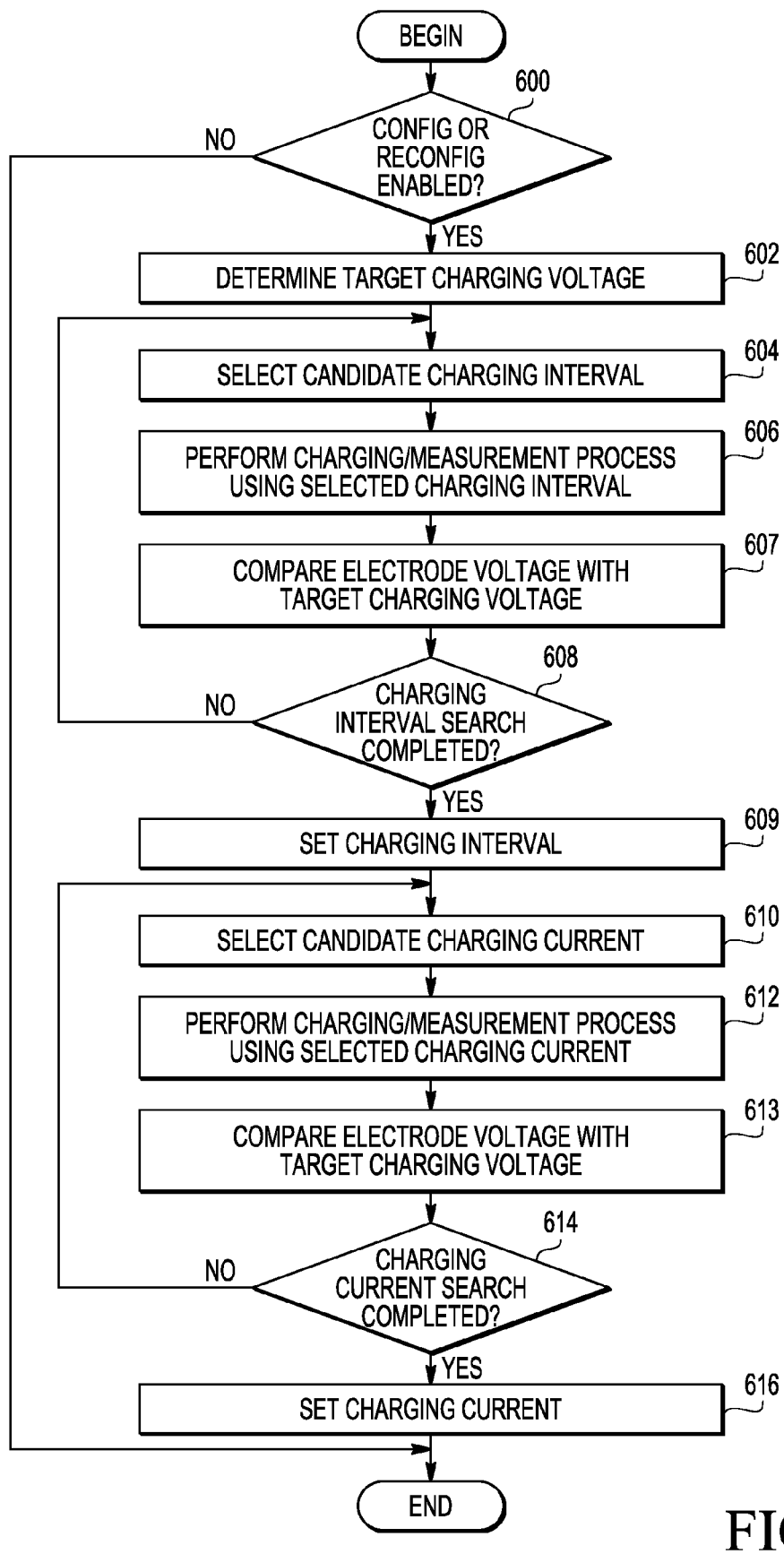
FIG. 6 is a flowchart of a method for configuring or reconfiguring the charging parameters for an electrode, according to an example embodiment.

FIG. 6 is a flowchart of a method for configuring or reconfiguring the charging parameters for an electrode, according to an example embodiment. For example, the method of FIG. 6 may be performed in conjunction with blocks 502 and/or 524 of FIG. 5. In an embodiment in which electrode configuration and/or electrode re-configuration are features that may be enabled and disabled, the method may begin, in block 600, by determining whether the configuration or re-configuration process is enabled or disabled. When the process is disabled, the method may end.

When the process is enabled, the method may proceed to block 602, in which a target charging voltage is determined. According to an embodiment, the target charging voltage may be a voltage within a target range that either corresponds to a pre-defined central range of the theoretical operating range for the device, or within a target range that is defined in the factory or by a device designer (e.g., target voltage range 312, which is defined by lower and upper voltage thresholds 308, 310, FIG. 3). The target charging voltage may be selected to be anywhere within the central range or the target range. According to a particular embodiment, the target charging voltage may be selected to be in the middle of the central range or the target range, although this is not essential. For example, in an example system in which a target range is defined to be between 0.7 volts and 1.0 volts, the target charging voltage may be selected to be 0.85 volts. For ease of computation, the target charging voltage may be defined in terms of an ADC count, according to an embodiment. For example, in an embodiment in which an ADC count of 540 (e.g., 0x87 hexadecimal) defines a lower voltage threshold, and an ADC count of 604 (e.g., 0x97 hexadecimal) defines an upper voltage threshold, the target charging voltage may be defined to correspond to an ADC count of 572 (e.g., 0x8F hexadecimal).

In blocks 604, 606, 607, and 608, a charging interval search is then performed. According to an embodiment, the charging interval search is an iterative process in which, during each iteration, the electrode is charged with a fixed charging current and a different one of a plurality of pre-defined, selectable charging intervals. For example, a set of pre-defined charging intervals may be accessible to the capacitive touch sensor (e.g., in data storage 212, FIG. 2). The set of pre-defined charging intervals may include from two to N values, for example. For explanation purposes only, an example of a pre-defined charging interval table is provided below as Table 1, where the table includes seven different charging interval values (i.e., N=7):

TABLE 1

Charging Interval Table

| Entry No. | Charging Interval Value (microseconds) |
|---|---|
| 1 | 0.5 |
| 2 | 1.0 |
| 3 | 2.0 |
| 4 | 4.0 |
| 5 | 8.0 |
| 6 | 16.0 |
| 7 | 32.0 |

It is to be understood that a charging interval table alternatively may include more or fewer than seven values, and that the charging interval values may be different from those shown in Table 1.

According to an embodiment, the charging interval search is performed as a binary search, in which a central charging interval value is selected from the table during the first searching interval (e.g., a charging interval value of 4.0 microseconds corresponding to entry number 4), and based on the results of the first iteration, a next charging interval value is selected during the second iteration, where the next selected charging interval value corresponds to an entry halfway toward the bottom or top of the table with respect to the central charging interval value (e.g., one of charging interval values 1.0 or 16.0 microseconds corresponding to entry numbers 2 and 6, respectively). Subsequent iterations continue to be performed until the binary search converges on a final value. For example, using the above example, the binary search would converge to a particular charging interval value (or table entry number) in three iterations. The below description of blocks 604, 606, 607, and 608 will be described in accordance with an embodiment that uses a binary search to determine a charging interval value. It is to be understood, however, that other searching methods alternatively may be used, in other embodiments. For example, entries in a table of pre-defined charging interval values may be selected linearly (e.g., starting from entry number 1), or may be selected in some other sequence.

The charging interval search process begins, in block 604, by selecting a candidate charging interval. For example, in a binary search embodiment, a first selected candidate charging interval may correspond to a central charging interval value (e.g., a charging interval value of 4.0 microseconds corresponding to entry number 4 of Table 1, above). In block 606, an electrode charging process may then be performed, by applying a fixed and pre-defined current to the electrode for a duration of time that equals the candidate charging interval. According to an embodiment, the fixed and pre-defined current may be a current in a range of selectable currents, as will be discussed in conjunction with blocks 610, 612, 613, and 614, below.

After completing the electrode charging process, an electrode measurement process may be performed during which the electrode voltage is measured. The singular electrode voltage measurement may then be evaluated, in block 607, or the charging and measurement processes may be repeated one or more times and a mathematical determination of the electrode voltage may be determined from the multiple electrode voltage measurements (e.g., an average of the multiple measurements). Either way, in block 607, the electrode voltage measurement is compared with the target charging voltage (as determined in block 602) to determine whether the electrode voltage measurement is higher than or lower than the target charging voltage. According to an embodiment, the electrode voltage measurement also may be represented as an ADC count, and the comparison performed in block 607 may include comparing the ADC count corresponding to the target charging voltage with the ADC count corresponding to the electrode voltage measurement.

In block 608, a determination is then made whether the charging interval search process is completed. The charging interval search process may be considered to be completed, for example, when a defined number of iterations have been performed in conjunction with the binary search (e.g., three iterations in the case of a charging interval table that includes seven entries). In an alternate embodiment (e.g., when a linear search through the charging interval table is performed), the charging interval search process may be considered to be completed when the last two iterations of the searching process resulted in electrode voltage measurements on either side of the target charging voltage.

When it is determined that the charging interval search process is not completed, then a next searching iteration is initiated by again selecting a candidate charging interval in block 604. In the binary search embodiment, the next candidate charging interval is selected based on the comparison made in block 607. More particularly, in a table such as Table 1 above, in which candidate charging intervals are arranged in an increasing order, a lower-valued, candidate charging interval for an entry halfway toward the beginning of the table (e.g., entry number 2) is selected when the measured electrode voltage is higher than the target charging voltage, or a higher-valued, candidate charging interval for an entry halfway toward the end of the table (e.g., entry number 6) is selected when the measured electrode voltage is lower than the target charging voltage. In a linear search embodiment, the next candidate charging interval may be selected as a next sequential entry in the table (e.g., if entry number 1 was selected for the first iteration, entry number 2 may be selected for the next iteration). Blocks 606, 607, and 608 may thereafter be performed for the next selected candidate charging interval.

When a determination is made, in block 608, that the charging interval search process is completed, then a final charging interval value for the electrode is set, in block 609. In either the binary search or linear search embodiments, the final charging interval value may be one of the last two candidate charging intervals evaluated (e.g., during the last two search iterations), whichever yielded an electrode voltage measurement that was closest to the target charging voltage. Alternatively, the final charging interval value may be a value that is between the last two candidate charging intervals evaluated (e.g., halfway between or some other distance that is related to how close the last measured electrode voltage was to the target charging voltage). The final charging interval value may be set, for example, by storing the final charging interval value in a memory location that is accessible to the capacitive touch sensor (e.g., in data storage 212, FIG. 2).

According to an embodiment, a charging current search is then performed in blocks 610, 612, 613, and 614. According to an embodiment, the charging current search is an iterative process in which, during each iteration, the electrode is charged with a fixed charging interval (e.g., the final charging interval set in block 609) and a different one of a plurality of pre-defined, selectable charging currents. For example, a set of pre-defined charging currents may be accessible to the capacitive touch sensor (e.g., in data storage 212, FIG. 2). The set of pre-defined charging currents may include from two to M values, for example. For explanation purposes only, an example of a pre-defined charging current table is provided below as Table 2, where the table includes fifteen different charging current values (i.e., M=15):

TABLE 2

Charging Current Table

| Entry No. | Charging Current Value (microamps) |
|---|---|
| 1 | 1 |
| 2 | 2 |
| 3 | 3 |
| 4 | 5 |
| 5 | 7 |

TABLE 2-continued

Charging Current Table

| Entry No. | Charging Current Value (microamps) |
|---|---|
| 6 | 9 |
| 7 | 11 |
| 8 | 16 |
| 9 | 22 |
| 10 | 27 |
| 11 | 31 |
| 12 | 38 |
| 13 | 44 |
| 14 | 54 |
| 15 | 63 |

It is to be understood that a charging current table alternatively may include more or fewer than fifteen values, and that the charging current values may be different from those shown in Table 2.

According to an embodiment, the charging current search is performed as a binary search, in which a central charging current value is selected from the table during the first searching interval (e.g., a charging current value of 16 millivolts corresponding to entry number 8), and based on the results of the first iteration, a next charging current value is selected during the second iteration, where the next selected charging current value corresponds to an entry halfway toward the bottom or top of the table with respect to the central charging current value (e.g., one of charging current values 5 or 38 microamps corresponding to entry numbers 4 and 12, respectively). Subsequent iterations continue to be performed until the binary search converges on a final value. For example, using the above example, the binary search would converge to a particular charging current value (or table entry number) in four iterations. The below description of block 610, 612, 613 and 614 will be described in accordance with an embodiment that uses a binary search to determine a charging current value. It is to be understood, however, that other searching methods alternatively may be used, in other embodiments. For example, entries in a table of pre-defined charging current values may be selected linearly (e.g., starting from entry number 1), or may be selected in some other sequence.

The charging current search process begins, in block 610, by selecting a candidate charging current. For example, in a binary search embodiment, a first selected candidate charging current may correspond to a central charging current value (e.g., a charging current value of 16 millivolts corresponding to entry number 8 of Table 2, above). In block 612, an electrode charging process may then be performed, by applying the candidate charging current to the electrode for a fixed duration of time (e.g., the final charging interval set in block 609).

After completing the electrode charging process, an electrode measurement process may be performed during which the electrode voltage is measured. The singular electrode voltage measurement may then be evaluated, in block 613, or the charging and measurement processes may be repeated one or more times and a mathematical determination of the electrode voltage may be determined from the multiple electrode voltage measurements (e.g., an average of the multiple measurements). Either way, in block 613, the electrode voltage measurement is compared with the target charging voltage (as determined in block 602) to determine whether the electrode voltage measurement is higher than or lower than the target charging voltage.

In block 614, a determination is then made whether the charging current search process is completed. The charging current search process may be considered to be completed, for example, when a defined number of iterations have been performed in conjunction with the binary search (e.g., four iterations in the case of a charging current table that includes fifteen entries). In an alternate embodiment (e.g., when a linear search through the charging current table is performed), the charging current search process may be considered to be completed when the last two iterations of the searching process resulted in electrode voltage measurements on either side of the target charging voltage.

When it is determined that the charging current search process is not completed, then a next searching iteration is initiated by again selecting a candidate charging current in block 610. In the binary search embodiment, the next candidate charging current is selected based on the comparison made in block 613. More particularly, in a table such as Table 2 above, in which candidate charging currents are arranged in an increasing order, a lower-valued, candidate charging current for an entry halfway toward the beginning of the table (e.g., entry number 4) is selected when the measured electrode voltage is higher than the target charging voltage, or a higher-valued, candidate charging current for an entry halfway toward the end of the table (e.g., entry number 12) is selected when the measured electrode voltage is lower than the target charging voltage. In a linear search embodiment, the next candidate charging current may be selected as a next sequential entry in the table (e.g., if entry number 1 was selected for the first iteration, entry number 2 may be selected for the next iteration). Blocks 612, 613, and 614 may thereafter be performed for the next selected candidate charging current.

When a determination is made, in block 614, that the charging current search process is completed, then a final charging current value for the electrode is set, in block 616. In either the binary search or linear search embodiments, the final charging current value may be one of the last two candidate charging currents evaluated (e.g., during the last two search iterations), whichever yielded an electrode voltage measurement that was closest to the target charging voltage. Alternatively, the final charging current value may be a value that is between the last two candidate charging currents evaluated (e.g., halfway between or some other distance that is related to how close the last measured electrode voltage was to the target charging voltage). The final charging current value may be set, for example, by storing the final charging current value in a memory location that is accessible to the capacitive touch sensor (e.g., in data storage 212, FIG. 2).

Having determined a new charging interval and charging current for the electrode, a validation process (not illustrated) may be performed, during which the electrode is again supplied with a current having the final charging current value for a duration equal to the final charging interval value. When the validation process yields a measured electrode voltage within the target range (e.g., target voltage range 312, FIG. 3) and/or a measured voltage that is sufficiently close to the target charging voltage, the method may end. Alternatively, when the validation process yields a measured electrode voltage that falls outside of the target range (e.g., target voltage range 312, FIG. 3) and/or a measured voltage that is not sufficiently close to the target charging voltage, the charging voltage and/or charging current searching processes may be repeated one or more times (e.g., with previously-determined final charging interval value(s) and/or final charging current value(s) excluded from the search). If, after a pre-defined number of repetitions, the validation process fails to produce a charging interval value and charging current value that yield an acceptable electrode voltage measurement, an error may be declared (e.g., an interrupt may be sent to system controller 102, FIG. 1).

Figure 7:
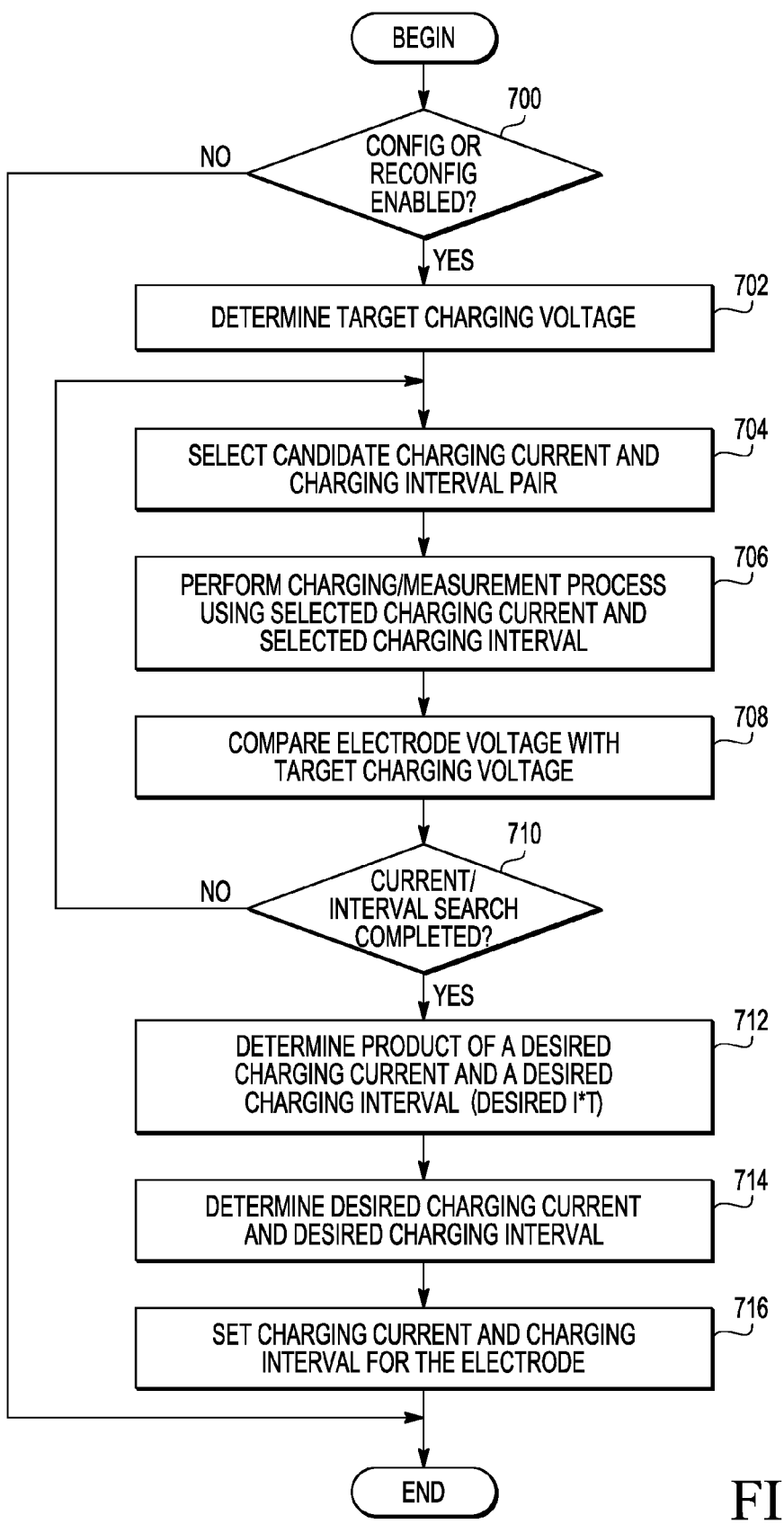
FIG. 7 is a flowchart of a method for configuring or reconfiguring the charging parameters for an electrode, according to another example embodiment.

FIG. 7 is a flowchart of a method for configuring or reconfiguring the charging parameters for an electrode, according to another example embodiment. For example, the method of FIG. 7 may be performed in conjunction with blocks 502 and/or 524 of FIG. 5. In an embodiment in which electrode configuration and/or electrode re-configuration are features that may be enabled and disabled, the method may begin, in block 700, by determining whether the configuration or re-configuration process is enabled or disabled. When the process is disabled, the method may end.

When the process is enabled, the method may proceed to block 702, in which a target charging voltage is determined. The process of determining a target charging voltage may be performed as described previously in conjunction with block 602 of FIG. 6, which process is not repeated here for purposes of brevity.

In blocks 704, 706, 708, and 710, a charging current/charging interval pair (referred to herein as a "current/interval pair") search is then performed. According to an embodiment, the current/interval pair search is an iterative process in which, during each iteration, the electrode is charged with a different current/interval pair, which includes a pre-defined, selectable charging current and a pre-defined, selectable charging interval. For example, a set of pre-defined current/interval pairs may be accessible to the capacitive touch sensor (e.g., in data storage 212, FIG. 2). The set of pre-defined current/interval pairs may include from two to X values, for example. For explanation purposes only, an example of a pre-defined current/interval pair table is provided below as Table 3, where the table includes twenty-five different current/interval pairs (i.e., X=25):

TABLE 3

Current/Interval Pair Table

| Entry No. | Charging Current Value (microamps) | Charging Interval Value (microseconds) | C low (picofarads) | Cmid (picofarads) | C high (picofarads) |
|---|---|---|---|---|---|
| 1 | 1 | 0.5 | 0.495721 | 0.584795 | 0.712893 |
| 2 | 2 | 0.5 | 0.991441 | 1.169591 | 1.425787 |
| 3 | 3 | 0.5 | 1.487162 | 1.754386 | 2.13868 |
| 4 | 1 | 2 | 1.982882 | 2.339181 | 2.851573 |
| 5 | 5 | 0.5 | 2.478603 | 2.923977 | 3.564467 |
| 6 | 7 | 0.5 | 3.470044 | 4.093567 | 4.990253 |
| 7 | 9 | 0.5 | 4.461485 | 5.263158 | 6.41604 |
| 8 | 3 | 2 | 5.948646 | 7.017544 | 8.55472 |
| 9 | 1 | 8 | 7.931529 | 9.356725 | 11.40629 |

TABLE 3-continued

Current/Interval Pair Table

| Entry No. | Charging Current Value (microamps) | Charging Interval Value (microseconds) | C low (picofarads) | Cmid (picofarads) | C high (picofarads) |
| --- | --- | --- | --- | --- | --- |
| 10 | 11 | 1 | 10.90585 | 12.8655 | 15.68365 |
| 11 | 31 | 0.5 | 15.36734 | 18.12865 | 22.09969 |
| 12 | 11 | 2 | 21.8117 | 25.73099 | 31.36731 |
| 13 | 31 | 1 | 30.73467 | 36.25731 | 44.19939 |
| 14 | 11 | 4 | 43.62341 | 51.46199 | 62.73461 |
| 15 | 31 | 2 | 61.46935 | 75.51462 | 88.39877 |
| 16 | 11 | 8 | 87.24681 | 102.924 | 125.4692 |
| 17 | 31 | 4 | 122.9387 | 145.0292 | 176.7975 |
| 18 | 11 | 16 | 174.4936 | 205.848 | 250.9385 |
| 19 | 31 | 8 | 245.8774 | 290.0585 | 353.5951 |
| 20 | 11 | 32 | 348.9873 | 411.6959 | 501.8769 |
| 21 | 31 | 16 | 491.7548 | 580.117 | 707.1902 |
| 22 | 22 | 32 | 697.9745 | 823.3918 | 1003.754 |
| 23 | 31 | 32 | 983.5095 | 1160.234 | 1414.38 |
| 24 | 44 | 32 | 1395.949 | 1646.784 | 2007.508 |
| 25 | 63 | 32 | 1998.745 | 2357.895 | 2874.386 |

In Table 3, above, each current/interval pair is matched with a range of capacitances (i.e., a low capacitance value, C low, a high capacitance value, C high, and a middle capacitance value, C mid, between C low and C high. The range of capacitance values (i.e., from C low to C high) for each current/interval pair indicate a range of capacitances that may be measurable given the charging current and the charging interval. The values in Table 3 were empirically determined by testing every possible combination of charging current and charging interval, determining the capacitance range for the tested current/interval pair, and eliminating current/interval pairs to generate a table in which any capacitance between a range of 0.495721 and 2874.386 picofarads may be detected, without including redundant or completely overlapping capacitance sub-ranges. In other words, the range of capacitances for each current/interval pair may slightly overlap the capacitance ranges of adjacent current/interval pairs, thus producing a table in which any capacitance within the desired range is detectable without significant redundancy. By paring down the number of current/interval pairs, the search process is reduced. It is to be understood that a current/interval pair table alternatively may include more or fewer than twenty-five values, the charging current and charging interval values may be different from those shown in Table 3, and/or the range of capacitances covered by the table may be different from that which is covered in Table 3.

According to an embodiment, the current/interval pair search is performed as a binary search, in which a central current/interval pair is selected from the table during the first searching interval (e.g., a charging current of 31 microamps and a charging interval of 1 microsecond corresponding to entry number 13), and based on the results of the first iteration, a next current/interval pair is selected during the second iteration, where the next selected current/interval pair corresponds to an entry halfway toward the bottom or top of the table with respect to the central current/interval pair (e.g., one of the current/interval pairs corresponding to entry numbers 6 or 7 and 19 or 20, respectively). Subsequent iterations continue to be performed until the binary search converges on a final value. For example, using the above example, the binary search would converge to a particular current/interval pair (or table entry number) in five iterations. The below description of blocks 704, 706, 708, and 710 will be described in accordance with an embodiment that uses a binary search to determine a current/interval pair. It is to be understood, however, that other searching methods alternatively may be used, in other embodiments. For example, entries in a table of pre-defined current/interval pairs may be selected linearly (e.g., starting from entry number 1), or may be selected in some other sequence.

The current/interval pair search process begins, in block 704, by selecting a candidate current/interval pair. For example, in a binary search embodiment, a first selected candidate current/interval pair may correspond to a central current/interval pair (e.g., a charging current of 31 microamps and a charging interval of 1 microsecond corresponding to entry number 13 of Table 3, above). In block 706, an electrode charging process may then be performed, by applying a charging current to the electrode for a duration of time that equal the candidate charging current and the candidate charging interval, respectively.

After completing the electrode charging process, an electrode measurement process may be performed during which the electrode voltage is measured. The singular electrode voltage measurement may then be evaluated, in block 708, or the charging and measurement processes may be repeated one or more times and a mathematical determination of the electrode voltage may be determined from the multiple electrode voltage measurements (e.g., an average of the multiple measurements). Either way, in block 708, the electrode voltage measurement is compared with the target charging voltage (as determined in block 702) to determine whether the electrode voltage measurement is higher than or lower than the target charging voltage. According to an embodiment, the electrode voltage measurement also may be represented as an ADC count, and the comparison performed in block 708 may include comparing the ADC count corresponding to the target charging voltage with the ADC count corresponding to the electrode voltage measurement.

In block 710, a determination is then made whether the current/interval pair search process is completed. The current/interval pair search process may be considered to be completed, for example, when a defined number of iterations have been performed in conjunction with the binary search (e.g., five iterations in the case of a current/interval pair table that includes twenty-five entries). In an alternate embodiment (e.g., when a linear search through the current/interval pair table is performed), the current/interval pair search process may be considered to be completed when the last two iterations of the searching process resulted in electrode voltage measurements on either side of the target charging voltage.

When it is determined that the current/interval pair search process is not completed, then a next searching iteration is initiated by again selecting a candidate current/interval pair in block 704. In the binary search embodiment, the next candidate current/interval pair is selected based on the comparison made in block 708. More particularly, in a table such as Table 3 above, in which candidate current/interval pairs are arranged in an order of increasing capacitance, a lower-ordered, candidate current/interval pair for an entry halfway toward the beginning of the table (e.g., entry number 6 or 7) is selected when the measured electrode voltage is higher than the target charging voltage, or a higher-ordered, candidate current/interval pair for an entry halfway toward the end of the table (e.g., entry number 19 or 20) is selected when the measured electrode voltage is lower than the target charging voltage. In a linear search embodiment, the next candidate current/interval pair may be selected as a next sequential entry in the table (e.g., if entry number 1 was selected for the first iteration, entry number 2 may be selected for the next iteration). Blocks 706, 708, 710 may thereafter be performed for the next selected candidate current/interval pair.

When a determination is made, in block 710, that the current/interval pair search process is completed, an intermediate charging current, $I_0$, and an intermediate charging interval, $T_0$, will have been determined as the charging current and the charging interval, respectively, of the finally selected current/interval pair. For example purposes only, assume that the current/interval pair search resulted in a selection of entry number 8 from Table 3, above, which corresponds to an $I_0$ of 3 microamps and a $T_0$ of 2 microseconds. In addition, a measured electrode voltage will have been determined that corresponds to the finally selected current/interval pair. The measured electrode voltage may be represented by an ADC count, $ADC_0$, for example. For example, once again, assume that a maximum ADC count in the system is 1024, and the measured electrode voltage corresponds to an ADC count, $ADC_0$ of 572. Based on the values of $I_0$, $T_0$, $ADC_0$, a product of a desired charging current and a desired charging interval (herein "desired I*T") may be mathematically determined, in block 712. According to an embodiment, the desired I*T may be determined according to the following equation:

$$I*T = \frac{I_0 \times T_0 \times ADC_{NUM}}{ADC_0}\left[\frac{V_{DD} - V_{DROP}}{V_{DD}}\right],$$

where $ADC_{NUM}$ is the number of possible ADC counts, and $V_{DROP}$ is a voltage difference between the supply voltage, $V_{DD}$, and an upper voltage threshold (e.g., upper voltage threshold 310, FIG. 3). With the example values given in the previous paragraph (i.e., $I_0$=3 microamps; $T_0$=2 microseconds, and $ADC_0$=572), and with $V_{DROP}$=0.7 volts and $V_{DD}$=1.7 volts, the above equation yields the following (units excluded):

$$I*T = \frac{3 \times 2 \times 1024}{572}\left[\frac{1.7 - 0.7}{1.7}\right] = 6.32,$$

Once the desired I*T is determined, then the desired charging current and the desired charging interval are separated from the desired I*T value, in block 714. According to an embodiment, separating the desired charging current and the desired charging interval includes correlating the desired I*T with a table of I*T ranges and associated charging intervals, and selecting the desired charging interval as the charging interval associated with an I*T range with which the desired I*T correlates. For explanation purposes only, an example of a pre-defined I*T range/charging interval table is provided below as Table 4:

TABLE 4

| | I*T range/charging interval table | | | | |
|---|---|---|---|---|---|
| Entry No. | I*T range (min) | I*T range (max) | Charging interval | Valid charging current (min) | Valid charging current (max) |
| 1 | 0.5 | 31.5 | 0.5 | 0.5 | 31.5 |
| 2 | 1 | 63 | 1 | 31.5 | 63 |
| 3 | 2 | 126 | 2 | 63 | 126 |
| 4 | 4 | 252 | 4 | 126 | 252 |
| 5 | 8 | 504 | 8 | 252 | 504 |
| 6 | 16 | 1008 | 16 | 504 | 1008 |
| 7 | 32 | 2016 | 32 | 1008 | 2016 |

Although a table of seven entries having specified values is given as an example, an I*T range/charging interval table may include more or fewer entries and/or having different values may alternatively be used. In Table 4, the I*T range (min) values equal the associated charging interval (e.g., one of values 0.5 through 32 microseconds in powers of two) multiplied by the minimum available charging current (e.g., 1 microamp). The I*T range (max) values equal the associated charging interval (e.g., one of values 0.5 through 32 microseconds in powers of two) multiplied by the maximum available charging current (e.g., 63 microamps). As Table 4 indicates, some of the valid I*T ranges overlap, which means that some desired I*T values may yield the same capacitance range. For example, according to the above-given example, in which a desired I*T was determined to be 6.32, correlation of the desired I*T with the I*T ranges of Table 4 indicates that the desired I*T value falls into any one of the first four I*T ranges (i.e., entries 1-4), which correspond to charging interval values of 0.5, 1, 2, and 4 microseconds, respectively. According to an embodiment, a search for a valid I*T region (i.e., an I*T region that correlates with the desired I*T) is performed in ascending order (i.e., starting from entry 1). Accordingly, an entry may be selected that matches the shortest desired charging interval value first. For example, a desired I*T of 6.32 falls within the I*T range of the first entry (i.e., an I*T range of 0.5 to 31.5), and therefore the charging interval for the first entry (i.e., 0.5 microseconds) may be determined to be the desired charging interval value (i.e., the charging interval value that is separated from the desired I*T). In an alternate embodiment, an I*T range other than the I*T range corresponding to the shortest charging interval may be selected (e.g., an I*T range that correlates with the desired I*T that corresponds to the longest charging interval, or entry 4 with a charging interval of 4 microseconds in the above-given example).

Once the desired charging interval value is determined, the desired charging current may be determined. According to an embodiment, this includes dividing the desired I*T by the desired charging interval value. In the above-given example, with a desired I*T of 6.32 and a desired charging interval of 0.5, this yields a desired charging current of 6.32/0.5=12.64 microamps. When the desired charging current is not an integer value, the desired charging current may be rounded up or down to the nearest integer, according to an embodiment.

In block 716, a final charging current value and a final charging interval value for the electrode is set. The final charging current value and the final charging interval value may be set, for example, by storing the desired charging current value and the desired charging interval value in memory locations that are accessible to the capacitive touch sensor (e.g., in data storage 212, FIG. 2). The method may then end.

Thus, various embodiments of methods and apparatus for configuring a capacitive touch sensor device have been described above. The various embodiments enable individual charging current and charging interval settings to be established for each of multiple electrodes (e.g., electrodes 106-108, FIG. 1) during an initial automatic configuration process, and/or during automatic re-configuration processes that may be performed for any one or more of the system's electrodes.

An embodiment includes a capacitive touch sensor comprising an analog-to-digital converter (ADC) and a controller, operatively coupled to the ADC. The ADC is adapted to receive an analog voltage signal from an electrode, and to sample the analog voltage signal in order to produce a plurality of digital values. The controller is adapted to perform a first charging process by supplying the electrode with a first charging current for a first charging interval, and to determine, based on at least one of the plurality of digital values, whether a first electrode voltage value meets a criteria. When the first electrode voltage value does not meet the criteria, the controller is adapted to perform a configuration process that results in setting a second charging current and a second charging interval for the electrode which, in response to performing a second charging process, results in a second electrode voltage value that is more likely to meet the criteria.

According to a further embodiment, the controller is adapted to perform the configuration process by performing an iterative process in which the electrode is charged for a plurality of charging intervals and with a plurality of charging currents to determine the second charging interval and the second charging current. According to a further embodiment, the controller is further adapted to configure the electrode by storing the second charging current and the second charging interval for the electrode for use during one or more subsequent charging processes. According to a further embodiment, the controller is adapted to perform the iterative process by supplying a fixed charging current to the electrode for a plurality of charging intervals in order to determine the second charging interval, and supplying a plurality of charging currents for the second charging interval to determine the second charging current. According to a further embodiment, the controller is adapted to supply the fixed charging current to the electrode for the plurality of charging intervals by iteratively selecting, from a first pre-defined table, different charging intervals for which the charging current is to be supplied, and to supply the plurality of charging currents to the electrode for the second charging interval by iteratively selecting, from a second pre-defined table, different charging currents to be supplied to the electrode for the second charging interval. According to a further embodiment, the controller is adapted to select the different charging intervals from the first pre-defined table and to select the different charging currents from the second pre-defined table using binary searching processes. According to a further embodiment, the controller is adapted to perform the iterative process by charging the electrode using a plurality of candidate charging current/interval pairs in order to determine the second charging current and the second charging interval. According to a further embodiment, the controller is adapted to determine the plurality of candidate charging current/interval pairs by iteratively selecting, from a pre-defined table, different charging current/interval pairs to be used in charging the electrode. According to a further embodiment, the controller is adapted to select the different charging current/interval pairs from the pre-defined table using a binary searching process.

According to a further embodiment, the capacitive touch sensor further comprises a current source, operatively coupled to the controller, and adapted to supply the first charging current to the electrode for the first charging interval, and a timer, operatively coupled to the controller and to the current source, and adapted to provide a timing signal to the current source that enables the current source to initiate supply of the first charging current at a beginning of the first charging interval and to terminate supply of the first charging current at an end of the first charging interval. According to a further embodiment, the capacitive touch sensor further comprises data storage, operatively coupled to the controller, and configured to store values representing the first charging current, the first charging interval, the second charging current, and the second charging interval.

Another embodiment includes a capacitive touch sensor device comprising an electrode, and a capacitive touch sensor, operatively coupled to the electrode. The capacitive touch sensor is adapted to perform a first charging process by supplying the electrode with a first charging current for a first charging interval, to measure a first voltage resulting from the first charging process, and to determine, based on the first voltage, whether a first electrode voltage value meets a criteria. When the first electrode voltage value does not meet the criteria, the capacitive touch sensor device is adapted to perform a configuration process that results in setting a second charging current and a second charging interval for the electrode which, in response to performing a second charging process, results in a second electrode voltage value that is more likely to meet the criteria.

According to a further embodiment, the capacitive touch sensor further comprises one or more additional electrodes, wherein the capacitive touch sensor also is operatively coupled to the one or more additional electrodes, and is adapted to perform the configuration process for the electrode and each of the one or more additional electrodes so that a different charging current and a different charging interval may be set for the electrode and each of the one or more additional electrodes.

Yet another embodiment includes a method for configuring a capacitive touch sensor device. The method comprises the steps of performing a first electrode charging process by supplying a first electrode with a first charging current for a first charging interval, measuring a first voltage of the first electrode, which results from the first charging process, and determining, based on the first voltage, whether a first electrode voltage value meets a criteria. When the first electrode voltage value does not meet the criteria, the method includes determining a second charging current and a second charging interval for the first electrode that results in a second electrode voltage value that is more likely to meet the criteria. The method also includes storing the second charging current and the second charging interval for use during a subsequent electrode charging process of the first electrode.

According to a further embodiment, determining whether the first electrode voltage value meets the criteria comprises determining whether the first electrode voltage value falls within a target voltage range. According to a further embodiment, determining the second charging current comprises supplying a fixed charging current to the first electrode for a plurality of charging intervals by iteratively selecting, from a first pre-defined table, different charging intervals for which the fixed charging current is to be supplied to the first electrode, and determining the second charging current comprises supplying a plurality of charging currents to the first electrode for a fixed charging interval by iteratively selecting, from a second pre-defined table, different charging currents to be supplied to the first electrode for the fixed charging interval. According to a further embodiment, the steps of iteratively selecting the different charging intervals from the first pre-defined table and iteratively selecting the different charging currents from the second pre-defined table are performed using binary search processes. According to a further embodiment, determining the second charging current and determining the second charging interval comprises iteratively selecting, from a pre-defined table, different charging current/interval pairs, and charging the first electrode using each of the different charging current/interval pairs. According to a further embodiment, the steps of performing, measuring, determining, and storing are repeated for one or more additional electrodes, so that a different charging current and a different charging interval may be set for the electrode and each of the one or more additional electrodes.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A capacitive touch sensor comprising:
    a controller adapted
        to perform a first charging process by supplying an electrode with a first charging current for a first charging interval, wherein the first charging current and the first charging interval are pre-defined, and the first charging process is complete at an end of the first charging interval,
        to determine, based on at least one of a plurality of digital values, whether a first electrode voltage value measured upon completion of the first charging process meets a criteria, and
        when the first electrode voltage value does not meet the criteria, to perform a configuration process that results in setting a second charging current and a second charging interval for the electrode to be used as different pre-defined values during a subsequently-performed, second charging process, wherein supplying the electrode with the second charging current for the second charging interval during the second charging process results in a second electrode voltage value measured upon completion of the second charging process that is more likely to meet the criteria.

2. The capacitive touch sensor of claim 1, wherein the controller is adapted to perform the configuration process by performing an iterative process in which the electrode is charged for a plurality of charging intervals and with a plurality of charging currents to determine the second charging interval and the second charging current, and wherein the controller is further adapted to configure the electrode by storing a charging current and a charging interval for the electrode for use during one or more subsequent charging processes.

3. The capacitive touch sensor of claim 2, wherein the controller is adapted to perform the iterative process by charging the electrode using a plurality of candidate charging current/interval pairs in order to determine the second charging current and the second charging interval.

4. The capacitive touch sensor of claim 3, wherein the controller is adapted to determine the plurality of candidate charging current/interval pairs by iteratively selecting, from a pre-defined table, different charging current/interval pairs to be used in charging the electrode.

5. The capacitive touch sensor of claim 4, wherein the controller is adapted to select the different charging current/interval pairs from the pre-defined table using a binary searching process.

6. The capacitive touch sensor of claim 1, wherein the controller is adapted to determine whether the first electrode voltage value meets the criteria by determining whether the first electrode voltage value falls within or outside of a pre-defined range of voltage values.

7. The capacitive touch sensor of claim 1, wherein the controller is adapted to determine whether the first electrode voltage value meets the criteria by determining whether the first electrode voltage value is above or below a threshold.

8. The capacitive touch sensor of claim 1, further comprising:
    a current source, operatively coupled to the controller, and adapted to supply a charging current to the electrode for a charging interval; and
    a timer, operatively coupled to the controller and to the current source, and adapted to provide a timing signal to the current source that enables the current source to initiate supply of the charging current at a beginning of the charging interval and to terminate supply of the charging current at an end of the charging interval.

9. The capacitive touch sensor of claim 1, further comprising:
    data storage, operatively coupled to the controller, and configured to store values representing the first charging current, the first charging interval, the second charging current, and the second charging interval.

10. The capacitive touch sensor of claim 1, further comprising:
    an analog-to-digital converter (ADC), operatively coupled to the controller, and adapted to receive an analog voltage signal from the electrode, and to sample the analog voltage signal in order to produce the plurality of digital values.

11. A capacitive touch sensor comprising:
    a controller adapted
        to perform a first charging process by supplying an electrode with a first charging current for a first charging interval,
        to determine, based on at least one of a plurality of digital values, whether a first electrode voltage value meets a criteria, and
        when the first electrode voltage value does not meet the criteria, to perform a configuration process that results in setting a second charging current and a second charging interval for the electrode which, in response to performing a second charging process, results in a second electrode voltage value that is more likely to meet the criteria, wherein the controller is adapted to perform the configuration process by performing an iterative process in which the electrode is charged for a plurality of charging intervals and with a plurality of charging currents to determine the second charging interval and the second charging current, and wherein the controller is further adapted to configure the electrode by storing a charging current and a charging interval for the electrode for use during one or more subsequent charging processes, and wherein the controller is adapted to perform the iterative process by supplying a fixed charging current to the electrode for a plurality of charging intervals in order to determine the second charging interval, and supplying a plurality of charging currents for the second charging interval to determine the second charging current.

12. The capacitive touch sensor of claim 11, wherein the controller is adapted to supply the fixed charging current to the electrode for the plurality of charging intervals by iteratively selecting, from a first pre-defined table, different charging intervals for which the charging current is to be supplied, and to supply the plurality of charging currents to the electrode for the second charging interval by iteratively selecting, from a second pre-defined table, different charging currents to be supplied to the electrode for the second charging interval.

13. The capacitive touch sensor of claim 12, wherein the controller is adapted to select the different charging intervals from the first pre-defined table and to select the different charging currents from the second pre-defined table using binary searching processes.

14. A capacitive touch sensor device comprising:
an electrode; and
a capacitive touch sensor, operatively coupled to the electrode, and adapted
to perform a first charging process by supplying an electrode with a first charging current for a first charging interval, wherein the first charging current and the first charging interval are pre-defined, and the first charging process is complete at an end of the first charging interval,
upon completion of the first charging process, to measure a first voltage resulting from the first charging process,
to determine, based on the first voltage, whether a first electrode voltage value meets a criteria, and
when the first electrode voltage value does not meet the criteria, to perform a configuration process that results in setting a second charging current and a second charging interval for the electrode to be used as different pre-defined values during a subsequently-performed, second charging process, wherein supplying the electrode with the second charging current for the second charging interval during the second charging process results in a second electrode voltage value measured upon completion of the second charging process that is more likely to meet the criteria.

15. The capacitive touch sensor device of claim 14, further comprising:
one or more additional electrodes,
wherein the capacitive touch sensor also is operatively coupled to the one or more additional electrodes, and is adapted to perform the configuration process for the electrode and each of the one or more additional electrodes so that a different charging current and a different charging interval may be set for the electrode and each of the one or more additional electrodes.

16. The capacitive touch sensor device of claim 15, wherein the capacitive touch sensor comprises:
a controller adapted to determine whether an electrode voltage value meets the criteria, and to perform the configuration process;
a current source, operatively coupled to the controller, and adapted to supply a charging current for a charging interval; and
a multiplexer, operatively coupled to the current source and to the controller, and adapted to provide the charging current to the electrode or to one of the one or more additional electrodes, and to access an analog voltage signal for the electrode or for one of the one or more additional electrodes.

17. A method for configuring a capacitive touch sensor device, the method comprising the steps of:
performing, by circuitry of the capacitive touch sensor device, a first electrode charging process by supplying a first electrode with a first charging current for a first charging interval, wherein the first charging current and the first charging interval are pre-defined, and the first electrode charging process is complete at an end of the first charging interval;
upon completion of the first electrode charging process, measuring, by the circuitry, a first voltage of the first electrode, which results from the first electrode charging process;
determining, by the circuitry, whether a first electrode voltage value meets a criteria based on the first voltage;
when the first electrode voltage value does not meet the criteria, determining, by the circuitry, a second charging current and a second charging interval for the first electrode; and
storing, by the circuitry, the second charging current and the second charging interval for use as different pre-defined values during a subsequent electrode charging process of the first electrode, wherein supplying the electrode with the second charging current for the second charging interval during the subsequent electrode charging process results in a second electrode voltage value measured upon completion of the subsequent electrode charging process that is more likely to meet the criteria.

18. The method of claim 17, wherein the performing, measuring, determining, and storing steps are performed between two different detected touch states.

19. A method for configuring a capacitive touch sensor device, the method comprising the steps of:
performing, by circuitry of the capacitive touch sensor device, a first electrode charging process by supplying a first electrode with a first charging current for a first charging interval;
measuring, by the circuitry, a first voltage of the first electrode, which results from the first charging process;
determining, by the circuitry, whether a first electrode voltage value meets a criteria based on the first voltage;

when the first electrode voltage value does not meet the criteria, determining, by the circuitry, a second charging current and a second charging interval for the first electrode that results in a second electrode voltage value that is more likely to meet the criteria, wherein:
- determining the second charging interval comprises supplying a fixed charging current to the first electrode for a plurality of charging intervals by iteratively selecting, from a first pre-defined table, different charging intervals for which the fixed charging current is to be supplied to the first electrode, and
- determining the second charging current comprises supplying a plurality of charging currents to the first electrode for a fixed charging interval by iteratively selecting, from a second pre-defined table, different charging currents to be supplied to the first electrode for the fixed charging interval; and storing, by the circuitry, the second charging current and the second charging interval for use during a subsequent electrode charging process of the first electrode.

20. The method of claim 17, wherein determining the second charging current and determining the second charging interval comprises:
- iteratively selecting, from a pre-defined table, different charging current/interval pairs; and
- charging the first electrode using each of the different charging current/interval pairs.

* * * * *